Figure 1:
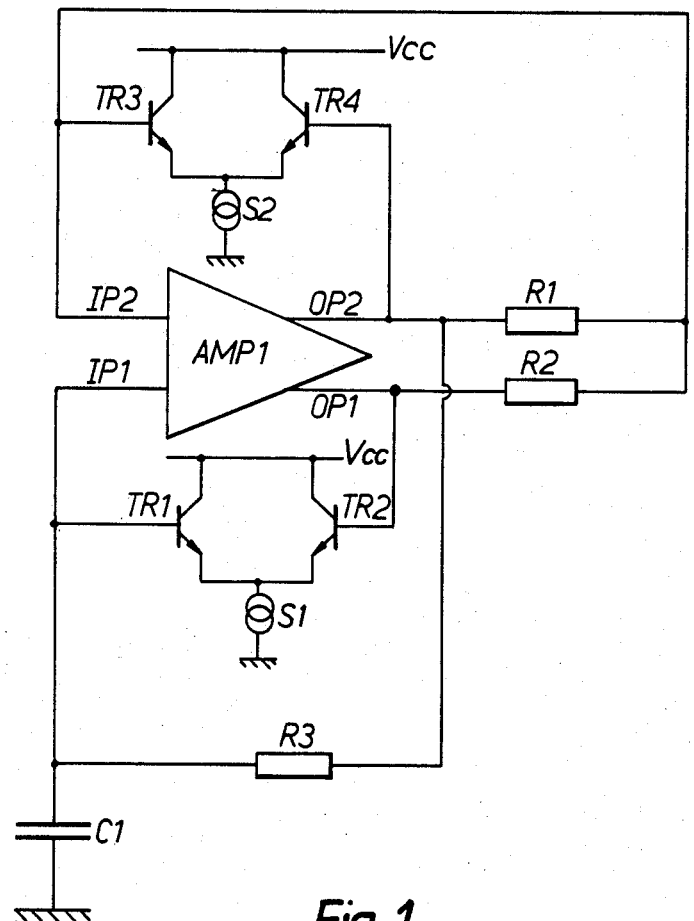

United States Patent [19]

Rokos

[11] Patent Number: 4,663,600
[45] Date of Patent: May 5, 1987

[54] COMPARATOR FOR USE IN ASTABLE MULTIVIBRATOR

[75] Inventor: George H. S. Rokos, Bishop's Stortford, England

[73] Assignee: Standard Telephones and Cables Public Limited Company, London, England

[21] Appl. No.: 734,603

[22] Filed: May 16, 1985

[30] Foreign Application Priority Data

May 23, 1984 [GB] United Kingdom ................ 8413228

[51] Int. Cl.[4] .......................................... H03K 3/023
[52] U.S. Cl. ................................... 331/111; 307/359; 331/143
[58] Field of Search .................. 331/111, 113 R, 143; 307/360, 362, 363, 355, 356, 359

[56] References Cited

U.S. PATENT DOCUMENTS 3,831,113  8/1974  Ahmed ................................ 331/111
4,390,799  6/1983  Schmoock ....................... 307/362 X
4,418,323  11/1983  Tokumo et al. ..................... 331/111

FOREIGN PATENT DOCUMENTS 2072448  9/1981  United Kingdom .
1601326  10/1981  United Kingdom .
2120486  11/1983  United Kingdom .

Primary Examiner—Siegfried H. Grimm
Attorney, Agent, or Firm—Kerkam, Stowell, Kondracki & Clarke

[57] ABSTRACT

In a comparator circuit in which the active element is a long-tailed transistor pair the input bias current to at least one input of the pair is maintained constant by providing a supplemental current from a current source. A multivibrator incorporating the comparator is also described.

1 Claim, 2 Drawing Figures

COMPARATOR FOR USE IN ASTABLE MULTIVIBRATOR

This invention relates to comparator circuits and to astable multivibrators incorporating such circuits.

In a conventional astable multivibrator circuit the accuracy of the switching levels, and hence the switching frequency, is limited by a number of factors. The most important of these are the stability of the output voltages, the magnitude of the input offset voltages and bias currents, and the propagation delay of the astable circuit. These problems are particularly acute for circuits designed to operate at low supply voltages.

Attempts have been made to reduce the offset voltage in conventional astable circuits by the use of a comparator which compares the timing capacitor voltage with a switched reference voltage. Such a comparator comprises a long-tailed transistor pair to which the capacitor and reference voltage are directly coupled. Such an arrangement however results in an input bias current which changes as the capacitor is pulled up and pulled down. In general bias current variations have the effect of shortening the period of the astable.

Standard techniques of minimizing this effect require either minimization of the operating current, which increases the comparator propagation delay, or provision of an input buffer stage. The latter technique increases the offset voltage and requires either the provision of complementary devices or a higher limit to the minimum operating supply voltage of the circuit.

The object of the present invention is to minimize or to overcome these disadvantages.

According to the invention there is provided a comparator circuit comprising a long-tailed transistor pair, the improvement comprising the provision of current source means whereby in use an input bias current to at least one input of the transistor pair is supplemented to maintain the current to that input at a substantially constant value.

According to the invention there is further provided an astable multivibrator circuit, including an amplifier having a differential input comprising a longtailed transistor pair and one or more outputs, a capacitor coupled to one input whereby the period of the circuit is determined, and current source means controlled by the switching state of the multivibrator whereby a bias current supplied to an input of the circuit is supplemented as to maintain that current at a substantially constant value.

The circuit is of general application but may for example form part of a data bus transceiver.

Figure 2:
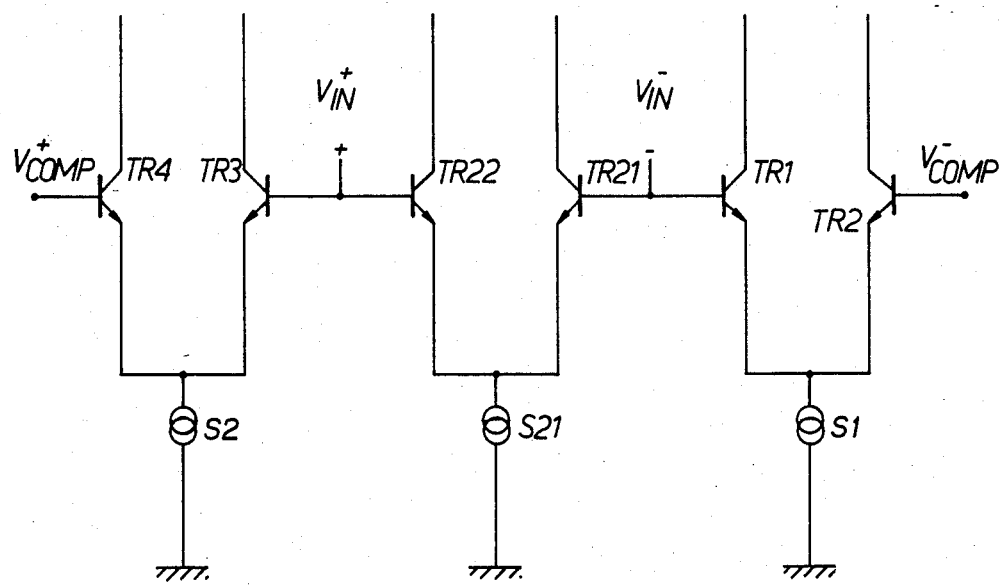

An embodiment of the invention will now be described with reference to the accompanying drawings in which:

FIG. 1 is a schematic diagram of an astable multivibrator circuit;

and FIG. 2 shows the combination of a comparator input and bias maintaining circuit for use in the circuit of FIG. 1.

Referring to the drawings, the circuit includes a differential amplifier or comparator AMP 1 having an input comprising a long tailed transistor pair and one or more outputs OP1 and OP2, two being shown in the drawing. Feedback paths from the outputs to both inputs are provided by resistors R1, R2 and R3. A capacitor C1 coupled to one input IP1 of the amplifier determines, together with resistor R3 and the ratio R1:R2, the switching frequency of the circuit.

The input bias current to the input IP1 of the amplifier is stabilised by a current generator coupled between the output OP1 and input IP1. Typically this current generator comprises a long tailed pair of transistors TR1, TR2 whose collectors are coupled to the circuit supply rail Vcc and whose common emitters are coupled to the circuit ground via a constant current source S1. Thus the current bias to that input IP1 is maintained substantially constant by substituting an alternative current supply for the periods at which the input current would otherwise fall to its minimum value.

Further stability of the circuit may be achieved by coupling a similar current generator comprising transistors TR3, TR4 and current source S2 between the output OP2 and the input IP2.

The detail of the comparator input to the astable circuit is shown in FIG. 2. The differential amplifier comprises a long tailed transistor pair TR21, TR22 whose common emitters are grounded via constant current source S21. The inputs to the amplifier comprise the base electrodes of the two transistors of the pair. The outputs of the amplifier comprise the collector electrodes of the pair. Compensation of the input bias currents to TR21 and TR22 is provided as previously described by the respective transistor pairs TR1/2 and TR3/4, the transistor base voltages being such that $V_{comp}{}^+ - V_{in}{}^+$ and $V_{comp}{}^- - V_{in}{}^-$ are of the same polarity as $V_{in}{}^+ - V_{in}{}^-$.

While the circuit has been described in terms of discreet components it will be appreciated that it can readily be integrated as a single device or as part of a larger device.

I claim:

1. An astable multivibrator circuit, comprising an amplifier having a differential input comprising first and second inputs of a long tailed transistor pair and having first and second outputs, a first feedback path from the first and second outputs to said first input via respective first and second resistors, a second feedback path from one of said outputs to said second input via a third resistor, a reference capacitor coupled to said second input, and first and second current source means coupled to said first and second outputs, respectively, and to said first and second inputs, respectively, for supplementing bias current supplied to the inputs so as to maintain the current at a substantially constant value, and wherein each said current source means comprises a long tailed transistor pair, a base of one transistor of the pair being connected to a corresponding output and a base of the other transistor of the pair being connected to the corresponding input.

* * * * *